United States Patent
Endres et al.

(10) Patent No.: US 9,671,608 B2
(45) Date of Patent: Jun. 6, 2017

(54) ILLUMINATION SYSTEM FOR EUV LITHOGRAPHY

(71) Applicant: Carl Zeiss SMT GmbH, Oberkochen (DE)

(72) Inventors: Martin Endres, Koenigsbronn (DE); Jens Ossmann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/489,943

(22) Filed: Sep. 18, 2014

(65) Prior Publication Data
US 2015/0002925 A1  Jan. 1, 2015

Related U.S. Application Data

(63) Continuation of application No. 12/235,277, filed on Sep. 22, 2008, now abandoned, which is a
(Continued)

(30) Foreign Application Priority Data

May 4, 2006  (DE) .................. 10 2006 020 734

(51) Int. Cl.
*G02B 26/08* (2006.01)
*G03F 7/20* (2006.01)
(Continued)

(52) U.S. Cl.
CPC ......... *G02B 26/0833* (2013.01); *G02B 17/06* (2013.01); *G03F 7/70075* (2013.01); *G03F 7/70116* (2013.01); *G02B 5/09* (2013.01)

(58) Field of Classification Search
CPC .. G02B 17/06; G02B 26/0833; G02B 5/0891; G02B 5/09; G03F 7/70075; G03F 7/70116
See application file for complete search history.

(56) References Cited

U.S. PATENT DOCUMENTS 5,581,605 A    12/1996 Murakami et al.
6,195,201 B1 *  2/2001 Koch ................... G03F 7/70075
                                                              355/67
(Continued)

FOREIGN PATENT DOCUMENTS

DE    102 19 514     11/2003
EP    1 026 547       8/2000
(Continued)

OTHER PUBLICATIONS

"Extension." Merriam-Webster.com. Merriam-Webster, n. d. Web. Dec. 2, 2016.*

(Continued)

*Primary Examiner* — Wyatt Stoffa
(74) *Attorney, Agent, or Firm* — Fish & Richardson P.C.

(57) ABSTRACT

The disclosure relates to an illumination system for EUV lithography, as well as related elements, systems and methods. In some embodiments, an illumination system includes a first optical element and a second optical element. The first optical element can include a plurality of first facet elements configured so that, when impinged by respective partial beams of radiation, the plurality of first facet elements produce secondary light sources. The second optical element can include a second optical element including a plurality of second facet elements. Each of the plurality of second facet elements can be assigned to at least one of the plurality of first facet elements. The plurality of second facet elements can be configured to be impinged by the radiation via the first optical element.

31 Claims, 9 Drawing Sheets

Related U.S. Application Data continuation of application No. PCT/EP2007/003609, filed on Apr. 25, 2007.

(51) Int. Cl.
 *G02B 17/06* (2006.01)
 *G02B 5/09* (2006.01)

(56) References Cited

U.S. PATENT DOCUMENTS

| | | | |
|---|---|---|---|
| 6,658,084 B2* | 12/2003 | Singer | B82Y 10/00 378/145 |
| 6,737,662 B2 | 5/2004 | Mulder et al. | |
| 7,196,841 B2 | 3/2007 | Melzer et al. | |
| 2002/0186811 A1* | 12/2002 | Weiss | B82Y 10/00 378/34 |
| 2003/0086524 A1 | 5/2003 | Schultz et al. | |
| 2004/0108467 A1* | 6/2004 | Eurlings | G03F 7/70116 250/492.1 |
| 2004/0227922 A1* | 11/2004 | Dierichs | G03F 7/70075 355/71 |
| 2004/0256575 A1* | 12/2004 | Singer | B82Y 10/00 250/492.2 |
| 2005/0146702 A1* | 7/2005 | Eurlings | G03F 7/70075 355/67 |
| 2005/0174650 A1* | 8/2005 | Melzer | G02B 26/0816 359/627 |
| 2006/0119824 A1* | 6/2006 | Dierichs | G03F 7/70033 355/67 |
| 2007/0041004 A1* | 2/2007 | Suzuki | B82Y 10/00 355/67 |
| 2007/0058274 A1 | 3/2007 | Singer et al. | |
| 2007/0115449 A1* | 5/2007 | Dierichs | G03F 7/70075 355/68 |
| 2008/0225259 A1* | 9/2008 | Singer | B82Y 10/00 355/67 |
| 2009/0033903 A1* | 2/2009 | Komatsuda | G02B 27/0905 355/66 |
| 2009/0041182 A1 | 2/2009 | Endres et al. | |
| 2009/0191489 A1* | 7/2009 | Sandstrom | B23K 26/032 430/321 |
| 2015/0355555 A1* | 12/2015 | Maul | G02B 5/09 355/71 |
| 2016/0004164 A1* | 1/2016 | Ruoff | G03F 7/70075 355/71 |

FOREIGN PATENT DOCUMENTS

| | | |
|---|---|---|
| JP | 2000-223415 | 8/2000 |
| JP | 2003-022967 | 1/2003 |

OTHER PUBLICATIONS

The European Office Action for corresponding EP Appl No. 07 724 539.7, dated Aug. 9, 2012.

The Japanese Office Action for corresponding JP Appl No. 2012-085160, dated Oct. 24, 2013.

* cited by examiner

ILLUMINATION SYSTEM FOR EUV LITHOGRAPHY

CROSS-REFERENCE TO RELATED APPLICATIONS

This application is a continuation of, and claims priority under 35 USC 120 to, U.S. application Ser. No. 12/235,277, filed Sep. 22, 2008, which is a continuation of, and claims priority under 35 USC 120 to international application PCT/EP2007/003609, filed Apr. 25, 2007, which claims priority to German Application No. 10 2006 020 734.3, filed May 4, 2006. U.S. application Ser. No. 12/235,277 and international application PCT/EP2007/003609 are incorporated by reference herein in their entirety.

FIELD

The disclosure relates to an illumination system for EUV lithography, as well as related elements, systems and methods.

BACKGROUND

Illumination systems for EUV lithography are known. In some illumination systems, different illumination settings can be produced using displaceable field facet elements. In certain instances, with each of the different illumination settings, the object surface is illuminated with a different distribution of illumination angles.

SUMMARY

In some embodiments, the disclosure provides an illumination system, such as an illumination system for EUV lithography, with which it is possible to change between various illumination settings even when using an optical element with relatively few facet elements.

In certain embodiments, the disclosure provides an illumination system in which at least two of the first facet elements are configured and oriented such that they are imaged by the optical arrangement in one and the same of at least two partial fields of the illumination field which make up the entire illumination field. An intersection between the partial fields, if such an intersection exists, is usually smaller than each of the partial fields contributing to the intersection.

It has been found that it is not absolutely necessary to reproduce all the first facet elements in one and the same image area, but that it is possible to configure the illumination field as an assembly of individual partial fields which together make up the complete illumination field. In so doing, the entire illumination field is not illuminated via any of the partial fields. This basic approach allows the second facet elements to be used in a more flexible manner. These second facet elements may be irradiated by a plurality of first facet elements which are at a spatial distance from one another. The partial beams of EUV radiation emanating from the various first facet elements which act on one and the same second facet element are then imaged in the various partial fields. This makes it possible to image the partial beams of EUV radiation, associated with a plurality of first facet elements, by one and the same second facet element. This flexibility allows a second optical element with a relatively small number of second facet elements to be used to produce various illumination settings, while still allowing the production of an illumination setting, using a second optical element of this type, in which illumination setting a 1:1 assignment of the first and second facet elements is provided. Different illumination settings may therefore be produced without a loss of light and without exchanging optical components. A conventional setting, such as a homogeneous illumination of the second optical element may be produced while tightly filling the second optical element. Dividing the illumination field into at least two partial fields makes it possible to preset an EUV intensity profile in the displacement direction of the object. It is possible, for example, to set as the default a Gaussian, Lorenzian, Trapezoidal or other profile. By displacing the object presetting the object surface perpendicularly to the partial field division of the illumination field, it is possible to ensure that the object is illuminated over all partial fields, so that each partial field plays a part in illuminating a predetermined object point. This sequential illumination of object points over the partial fields may be utilised to achieve, for example, a desired activation of a sensitive wafer layer which is an example of an object surface to be illuminated.

Displaceable first facet elements, which are movable between various setting positions by actuators associated in each case with the selected first facet elements, and which, in each setting position, deflect the partial beam associated in each case therewith to produce one of the predetermined illumination settings, lead to the possibility of automatically changing between various illumination settings.

The number of partial fields, which corresponds to the maximum number of first facet elements which are able to act on the same second facet element, is at the same time the minimally desired number of partial fields. The result is a compact illumination field. Two, three or more first facet elements may be allocated to a second facet element to act thereon.

A division of the illumination field into at least two adjacent partial fields in the form of partial field strips, which can have the same surface area, allows a comparatively simply constructed optical arrangement. The partial fields can be adjacent to one another, such as in a scan direction of a projection illumination installation, with the illumination system being the component thereof. This can help ensure that a substrate to be illuminated, for example a wafer which is scanned by the illumination field, passes the at least two partial fields in succession.

Curved first facet elements and/or partial fields of the illumination system can reduce the restrictions made on the optical arrangement.

Arranging the facet elements such that at least one of the second facet elements may be acted on by precisely two adjacent first facet elements can reduce restrictions on the imaging, which can avoid large angles between the individual partial beams of the EUV radiation.

Second facet elements, which may be displaced by an actuator associated in each case with the selected second facet elements for displacing the latter between various setting positions, increase the flexibility of the illumination system.

An illumination system in which at least one of the group of first and second facet elements are configured as reflective elements can have low losses.

An arrangement in which the number of the first facet elements is identical to the number of the second facet elements can allow a 1:1 assignment of the first facet elements to the second facet elements.

Intersections between the partial fields of the illumination field which are less than 95% (e.g., less than 90%, less than 80%, less than 60%, less than 40%, less than 20%) of the smallest partial field contributing to the intersection, have proved to be advantageous for the practical realisation of the illumination system, such as for presetting a desired sequential illumination for the object surface.

Various embodiments of the illumination system disclosed herein can provide similar advantages.

In some embodiments, the disclosure provides a first as well as a second optical element for the illumination system.

The advantages of these optical elements can be the same as those already mentioned above with reference to the illumination system.

BRIEF DESCRIPTION OF THE DRAWINGS

Embodiments of the disclosure are described in more detail hereinafter with reference to the drawings, in which.

DETAILED DESCRIPTION

Figure 1:
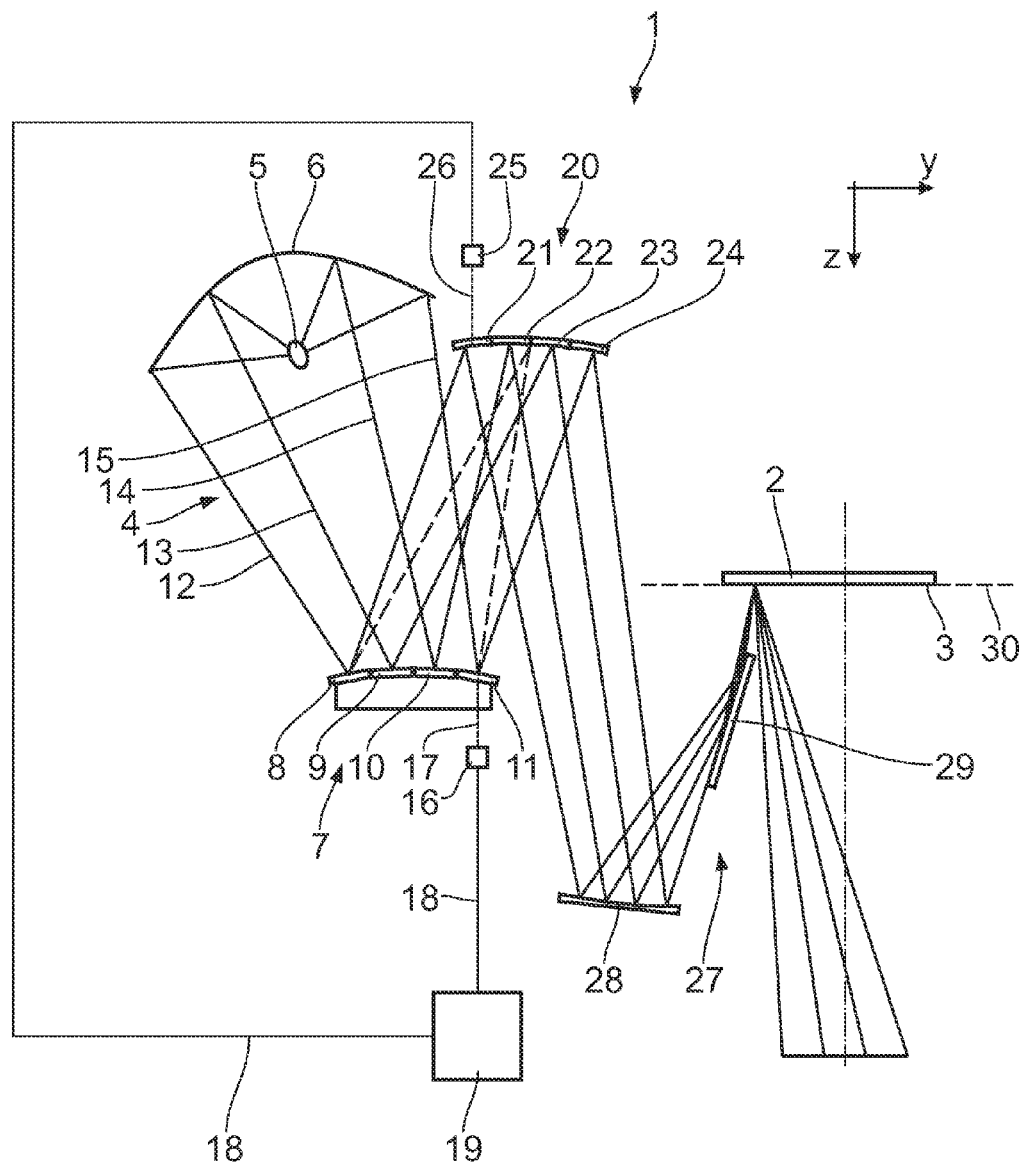
FIG. 1 schematically the beam path in an illumination system for EUV microlithography.

FIG. 1 shows an illumination system 1 for illuminating a predetermined illumination field 2 of an object surface 3 with extreme ultraviolet (EUV) radiation 4.

A plasma source can be used as the source 5 for the EUV radiation 4. The wavelength of the EUV radiation is, for example, between 10 and 20 nm.

A cartesian coordinate system (x, y, z) is used in FIGS. 1 and 2, reference being made hereinafter to the coordinates (x, y, z). In FIG. 1, the x direction extends perpendicularly to the plane of projection, the y direction extends to the right-hand side and the z direction extends downwards.

The EUV radiation emitted from the source 5 is initially collected by a collector 6 which reflects the EUV radiation like all the following steel guide components. The EUV radiation 4 emitted from the source 5 impinges on a first optical element 7, also termed a field scanning element. The first optical element 7 is used to produce secondary light sources in the illumination system 1. A reflecting surface of the first optical element 7, on which the EUV radiation 4 impinges, is divided into a plurality of first facet elements, of which four first facet elements 8 to 11 are shown by way of example in FIG. 1. The latter are associated with partial beams 12 to 15 of the EUV radiation 4. The first facet elements are rectangular, the extent thereof being substantially greater in the x direction than in the y direction. A typical aspect ratio of the first face elements 8 to 11 (x:y) is 20:1.

Each of the first facet elements 8 to 11 may be tilted between various setting positions about axes parallel to the x direction and y direction. For this purpose, each of the first facet elements 8 to 11 is connected to an associated actuator. In FIG. 1, an exemplary actuator 16 is shown which, as indicated in dashed lines at 17, is mechanically connected to the first facet element 11 for tilting the facet element 11 selectively about one of the two axes (x/y). The actuator 16 is connected to a central control device 19 via a control line 18. The control device 19 is connected with all the other actuators associated with the first facet elements 8 to 11 and with the first facet elements which are not shown via corresponding control lines (not shown).

Examples of arrangements of first facet elements are provided in FIGS. 7 to 14 of US 2003/0086524 A1, which is hereby incorporated by reference in its entirety.

A second optical element 20, also termed a pupil scanning element, is positioned at the location of the secondary light sources generated by the first optical element 7, generally in an image plane of the source 5. The EUV radiation 4 impinges the second optical element 20 via the first optical element 7. The surface of the second optical element 20 impacted by the EUV radiation 4 is divided into a plurality of second facet elements, of which four facet elements 21 to 24 are shown by way of example in FIG. 1. The second facet elements 21 to 24 are each assigned to one of the first facet elements 8 to 11, so that a respective secondary light source is generated at the location of the respectively charged second facet elements 21 to 24. In the illustration according to FIG. 1, the second facet element 21 is assigned to the first facet element 8, the second facet element 23 is assigned to the first facet element 9, the second facet element 22 is assigned to the first facet element 10 and the second facet element 24 is assigned to the first facet element 11.

Like the first facet elements 8 to 11, the second facet elements 21 to 24 and the other facet elements of the second optical element 20 which are not shown may be tilted via actuators about axes parallel to the x and y directions. FIG. 1 schematically shows an exemplary actuator 25 which is associated with the second facet element 21 and which, as shown in dashed lines at 26, is mechanically connected to the second facet element 21 to tilt the second facet element 21. The actuator 25 is also in a signal connection with the control device 19 via a control line 18.

The first facet elements as well as the second facet elements are typically reflective elements.

The second optical element 20 is part of an optical arrangement 27 which includes a plurality of optical components and forms an image of the first optical element 7 in a plane 30 predetermined by the object surface 3. Two other reflecting elements 28, 29 for EUV radiation belong to the optical arrangement 27. The reflecting element 28 is downstream of the second optical element 20 and reflects the EUV radiation at a small angle of incidence, for example an incidence angle of 30°. The reflecting element 29 is positioned in the subsequent beam path of EUV radiation 4 and reflects the EUV radiation by glancing incidence.

Figure 2:
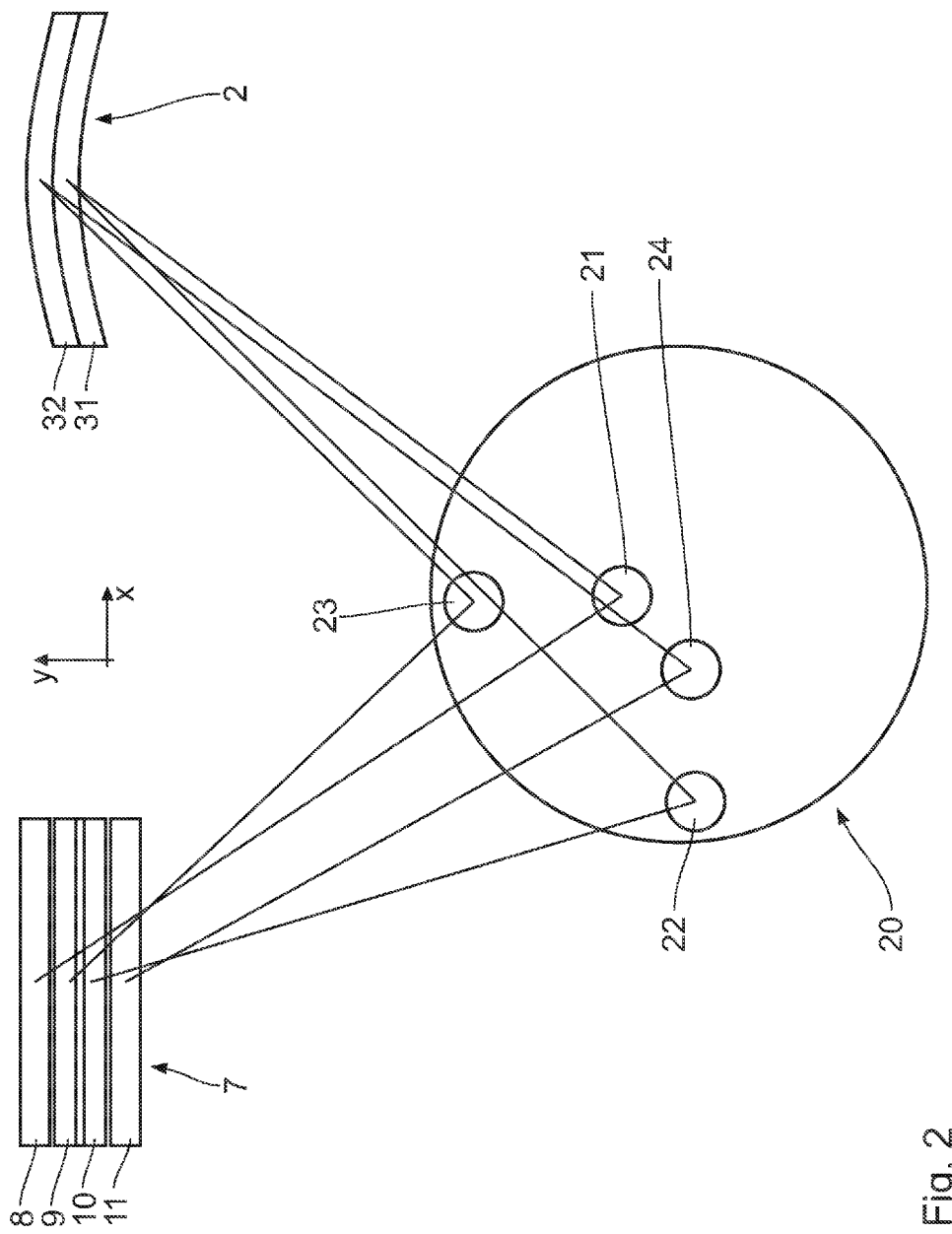
FIG. 2 schematically components of the illumination system according to FIG. 1 with the second facet elements illuminated to prepare a homogeneous, conventional illumination setting.

FIG. 2 shows in a highly schematic manner allocation relations between the first and the second facet elements during image formation in the illumination field 2. In this respect, the plane of projection of FIG. 2 is parallel to the x-y plane, and this also applies to the planes of projection of the following FIGS. 3 to 9. For illustration purposes, the components shown in FIGS. 2 to 9 have been rotated into the x-y plane. These components may in practice also be oriented in a different way. Components in FIGS. 2 to 9 which are the same as those which have already been described above with reference to FIG. 1, have the same reference numerals and will not be described again in detail.

FIG. 2 shows the four facet elements 8 to 11 as representative of all the first facet elements of the first optical element 7. Representative of all the second facet elements of the second optical element 20, the second facet elements 21 to 24 are arranged as follows in FIG. 2 for illustration purposes where the second facet elements 21 and 24 are components of an inner ring made of second facet elements. The second facet elements 22 and 23 are components of an outer ring of second facet elements. The overall round second optical element 20 has a plurality of such concentrically arranged rings of second facet elements. The second facet elements may be arranged in the manner of an evenly distributed x/y raster. FIG. 15 of US 2003/0086524 A1 provides an example of this.

The allocation of the first facet elements 8 to 11 to the second facet elements 21 to 24 is such that it produces a homogeneous, conventional illumination setting. Together with other second facet elements which are not shown, all the second facet elements of the second optical element 20 (not only the illustrated second facet elements 21 to 24, but also all other second facet elements of the associated raster) are illuminated by a respective first facet element. The second optical element 20 is thus illuminated homogeneously.

The first facet elements 8 and 10 are configured and oriented in such a manner that they are imaged in a lower partial field 31 of the illumination field 2 by the optical arrangement 27 in the arrangement of FIG. 2. The first facet elements 9 and 11 are configured and oriented in such a manner that they are imaged in the upper partial field 32 of the illumination field 2 by the optical arrangement 27. The two partial fields 31, 32 have the same surface area. The partial fields 31, 32 have the same aspect ratio as the first facet elements 8 to 11. The two partial fields 31, 32 are slightly curved arcuately due to the imaging properties of the optical arrangement 27. The two partial fields 31, 32 make up the complete illumination field 2. In the idealised example shown in FIG. 2, the two partial fields 31, 32 are immediately adjacent to one another, without overlapping. In practice, the two partial fields 31, 32 can overlap in such a manner that the intersection of the two partial fields 31, 32 (the overlap region) is always smaller than the area of each partial field 31, 32.

In the embodiment according to FIG. 2, the first facet elements 8 to 11 are imaged in the image plane 30 with a negative magnification.

The division of the illumination field 2 into the two partial fields 31, 32 results in a portion of every second facet element being illuminated in each of the partial fields 31, 32, so that in each partial field, illumination takes place at selected illumination angles of all illumination angles which are present in the illumination setting according to FIG. 2. Only a superpositioning of both partial fields 31, 32 results in the object surface 3 being illuminated at all illumination angles of the illumination setting. This superpositioning is carried out by displacing the object surface 3 in the y direction. This displacement may be carried out continuously or in steps, in which case a step length should not be greater than the y extent of a partial field. In this way, each point on the object surface 3, which point passes through both partial fields 31, 32, integrates the exposure effect of the EUV radiation radiated therein, so that following the passage, an illumination has been carried out from all illumination angles possible in the illumination setting.

Figure 3:
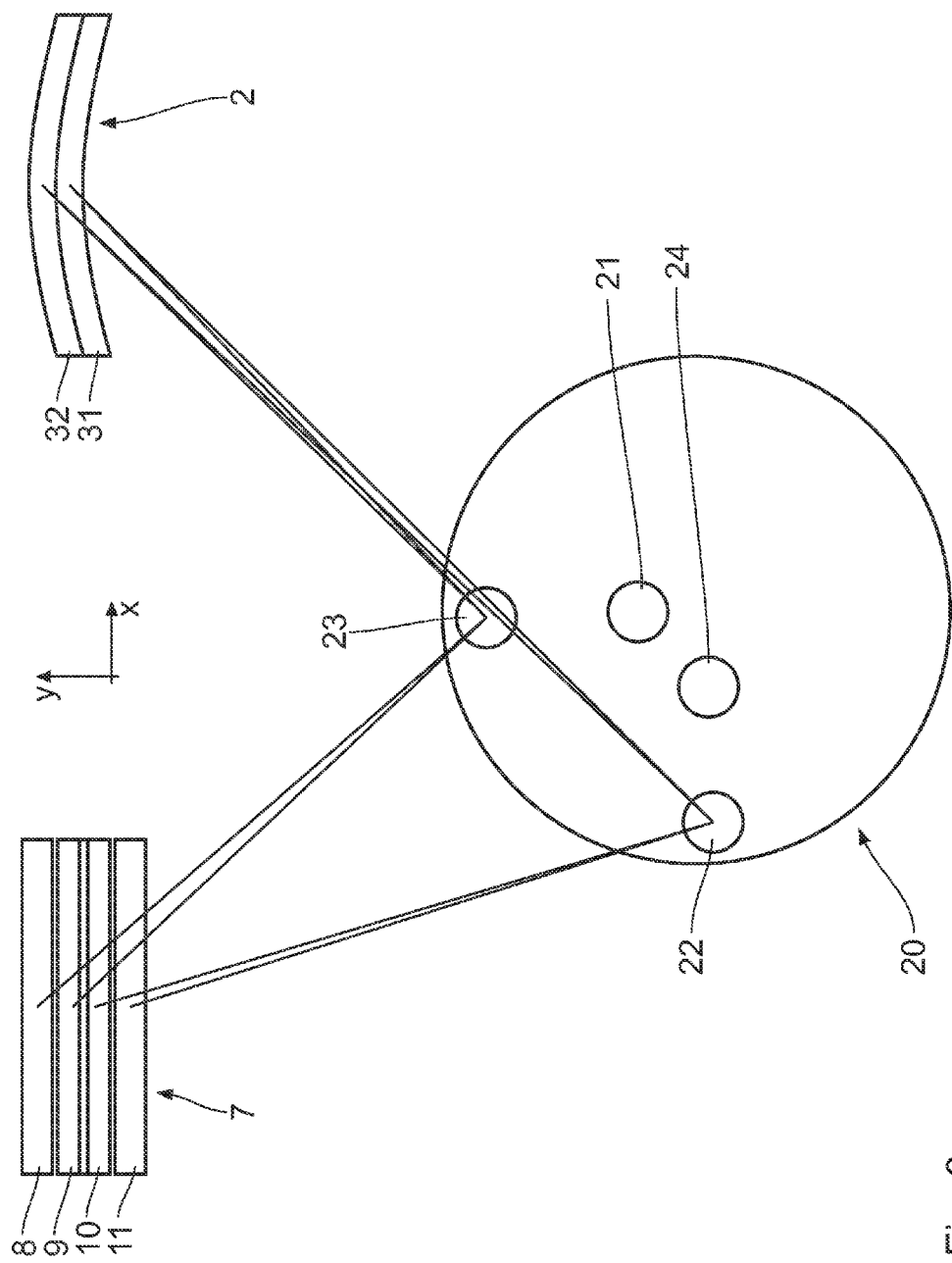
FIG. 3 a view similar to that of FIG. 2 with the second face elements illuminated to prepare an annular setting of a large diameter.

FIG. 3 shows another illumination setting which is possible with the arrangement of FIG. 1. This illumination setting is sometimes called a large annular setting. Starting from the situation according to FIG. 2, this large annular setting is set by tilting the first facet element 8 about its longitudinal axis parallel to the x direction and by tilting the second facet element 11 about its longitudinal axis parallel to the y direction. As a result of these tilting actions, the first facet element 8 now acts on the second facet element 23 and the first facet element 11 acts on the second facet element 22. The second facet element 22 is thus associated with two first facet elements, more specifically the first facet elements 10 and 11. Accordingly, the second facet element 23 is associated with the first facet elements 8 and 9. The second facet elements 22, 23 are arranged in such a manner that in the illumination setting according to FIG. 3, they are thus acted on respectively by two different adjacent first facet elements, more specifically on the one hand the first facet elements 10 and 11 and on the other hand by the first facet element 8, 9. The second facet elements 21, 24 are not acted on by the first optical element 7.

In FIG. 3, as in the setting according to FIG. 2, the lower partial field 31 is impacted by radiation from the first facet element 8 and 10. The upper partial field 32 is impacted by radiation from the first facet elements 9 and 11.

It is not necessary to displace the second facet elements 22, 23 when changing the illumination settings between those shown in FIGS. 2 and 3.

In the annular setting according to FIG. 3, the illumination angle varies between a minimum illumination angle different from zero and a maximum illumination angle.

Figure 4:
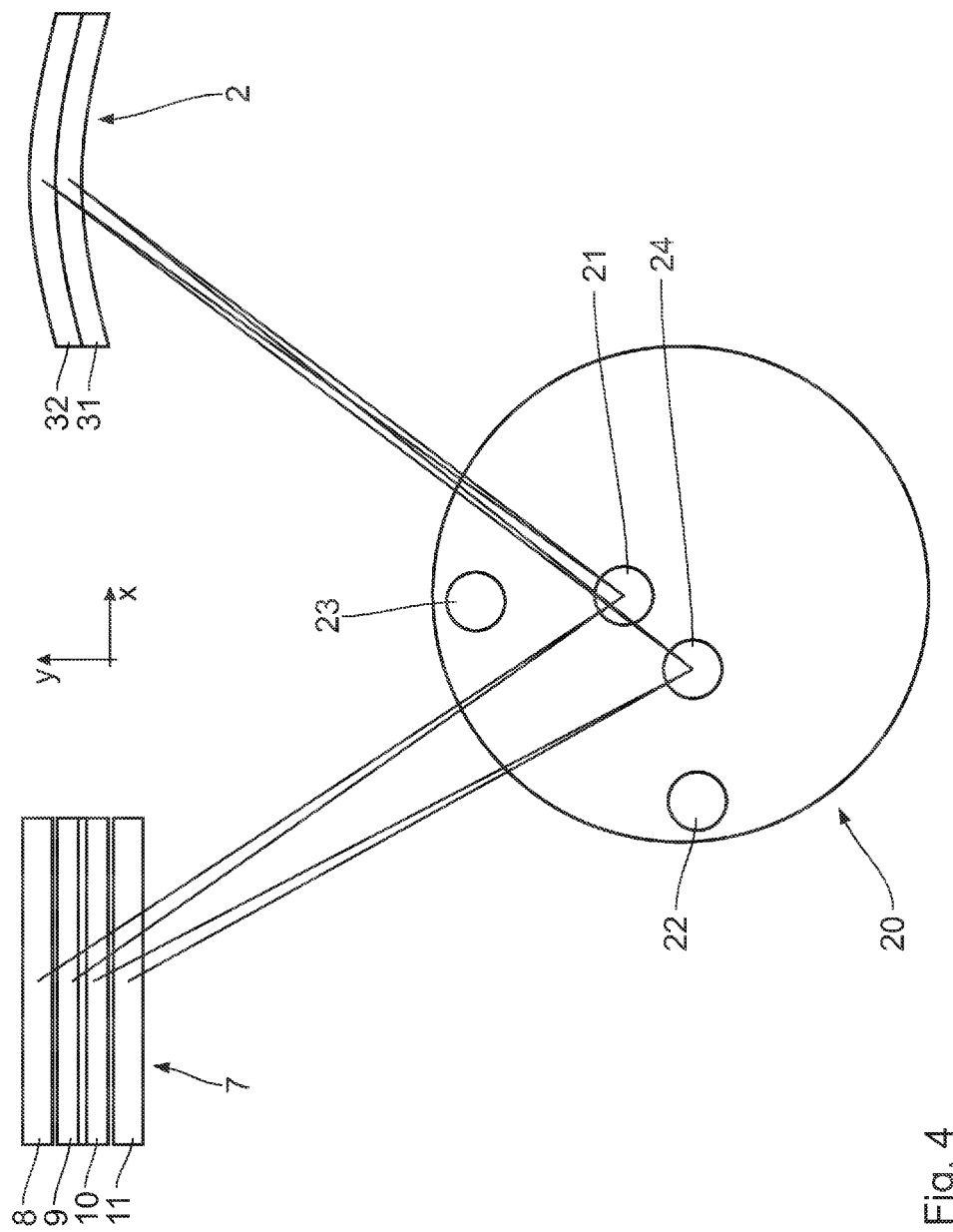
FIG. 4 a view similar to that of FIG. 2 with the second facet elements illuminated to prepare a homogeneous illumination setting with small illumination angles compared to the illumination setting of FIG. 2.

FIG. 4 shows another illumination setting which may be produced with the arrangement according to FIGS. 1 and 2. This is sometimes call a small conventional setting with a maximum illumination angle which is smaller than the minimum illumination angle of the annular setting according to FIG. 3.

Compared to the setting of FIG. 2, in FIG. 4 the two first facet elements 9 and 10 are tilted in the x and y direction respectively. The first facet element 9, together with the first facet element 8 now acts on the second facet element 21. The first facet element 10, together with the first facet element 11, now impacts on the second facet element 24. The second facet elements 22, 23 are not acted on by the first optical element 7.

As in the setting according to FIG. 2, in FIG. 4 the lower partial field 31 is impacted by radiation from the first facet elements 8 and 10. The upper partial field 32 is impacted by radiation from the first facet elements 9 and 11.

It is unnecessary to displace the second facet elements 21 and 24 when changing between the illumination settings according to FIGS. 2 and 4.

Figure 5:
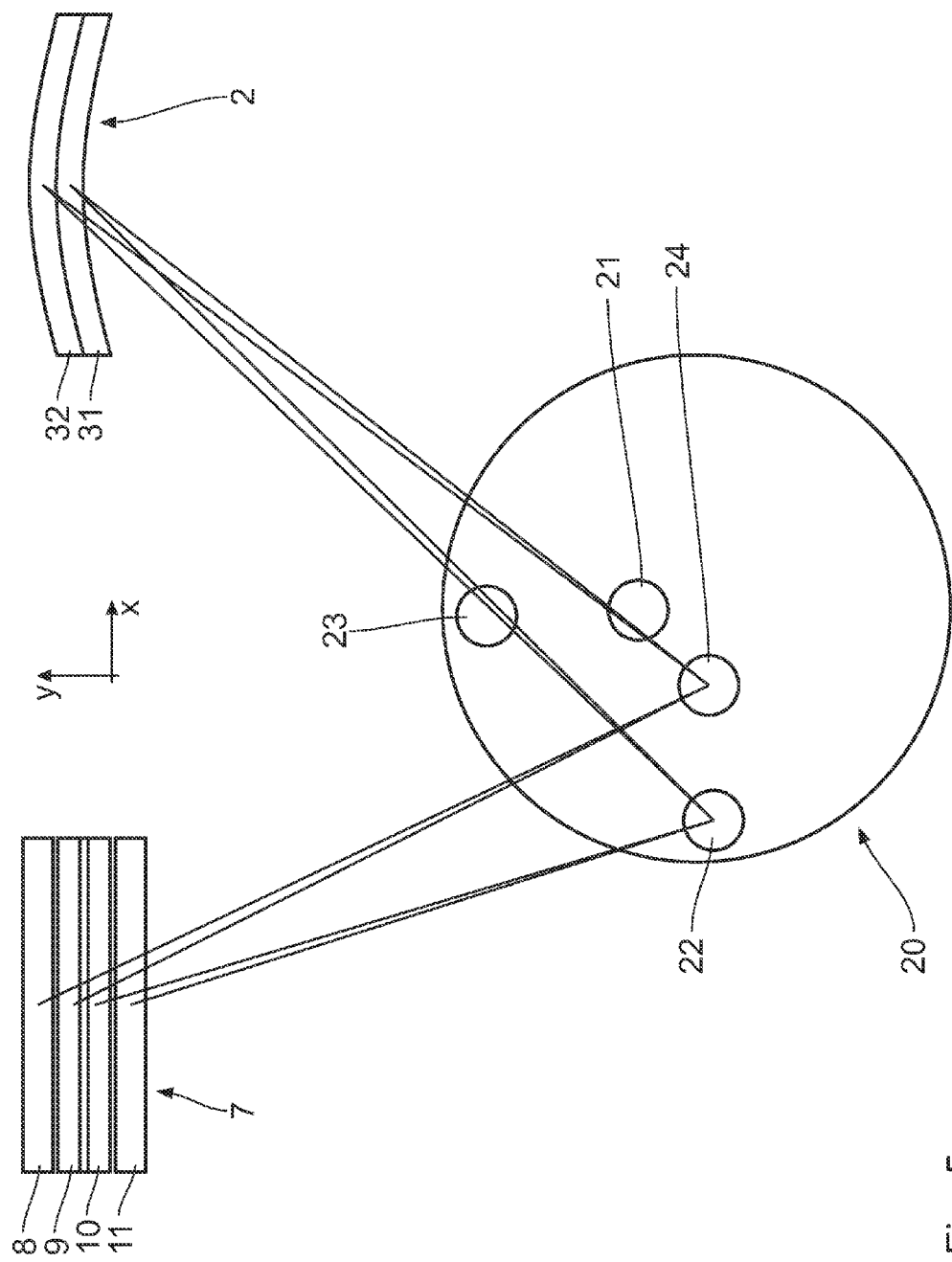
FIG. 5 a view similar to that of FIG. 2 with second facet elements illuminated to prepare an illumination setting in the manner of an x-dipole.

FIG. 5 shows another illumination setting which may be produced with the arrangement according to FIGS. 1 and 2. This is an illumination setting in the manner of what is sometimes called an x-dipole. In this case, illumination takes place in the x-z plane over a range of illumination angles which corresponds to the conventional setting according to FIG. 2. Perpendicularly (in the y-z plane), illumination takes place in a region of smaller illumination angles which may increase outwardly.

In the setting according to FIG. 5, the beam path, starting from the first facet elements 10, 11, corresponds to the beam path of the setting according to FIG. 3. The radiation emanating from the first facet elements 8 and 9 jointly impacts the second facet element 24. The radiation emanating from the first facet element 8 is imaged in the lower partial field 31, and the radiation emanating from the first facet element 9 is imaged in the upper partial field 32.

During the transition between the illumination settings according to FIGS. 2 and 5, the second facet element 24 can be tilted to ensure that the radiation emanating from the first facet elements 8 and 9 is in fact correctly imaged in the illumination field 2.

Figure 6:
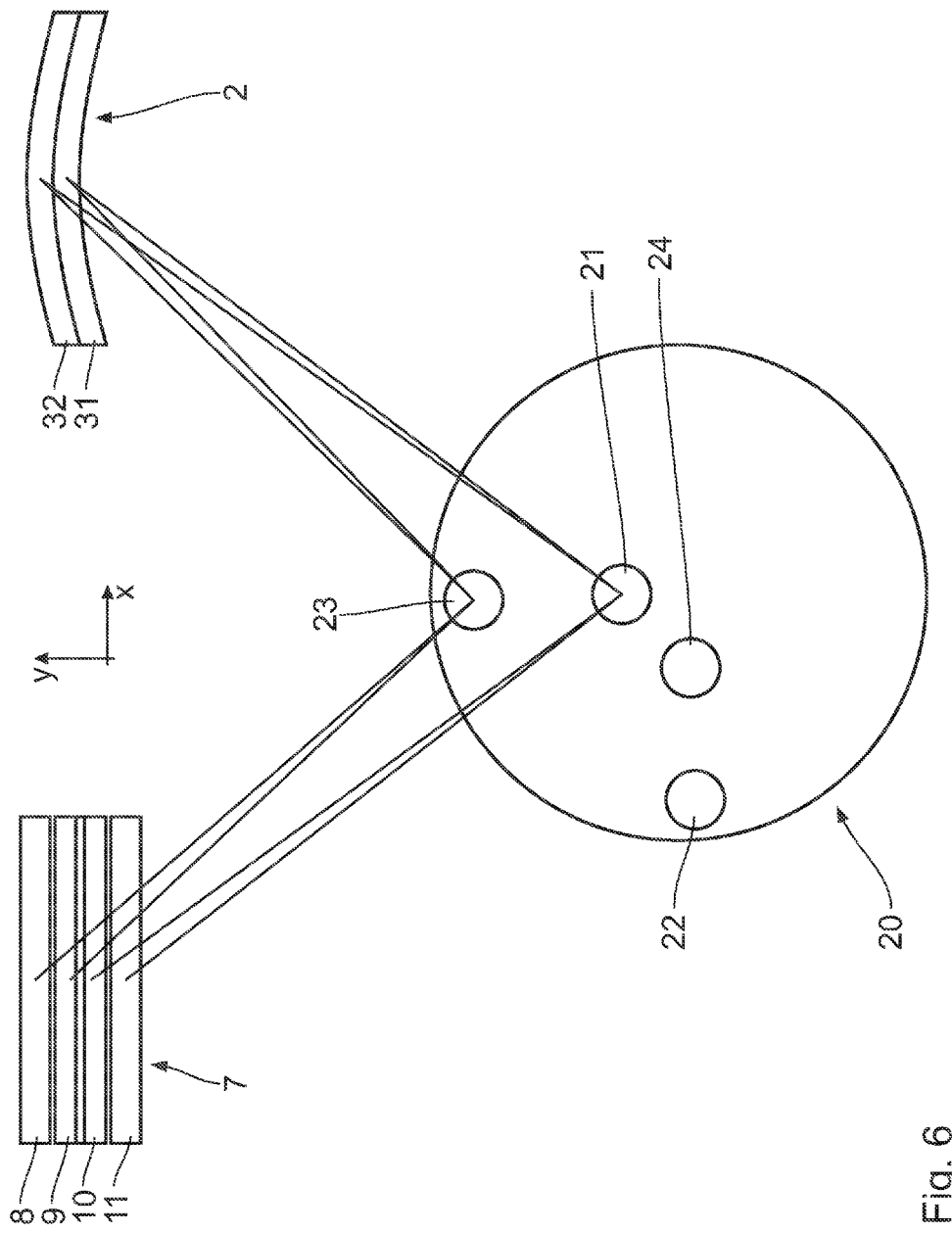
FIG. 6 a view similar to that of FIG. 2 with the second facet elements illuminated to prepare an illumination setting in the manner of a y-dipole.

FIG. 6 shows another illumination setting which may be produced in the arrangement according to FIGS. 1 and 2. This illumination setting is sometimes called y-dipole mode. According to that carried out in connection with the setting of FIG. 5, the illumination angles in the illumination field are distributed in the setting of FIG. 6 in such a manner that there is an angle distribution in the y-z plane as in the conventional setting according to FIG. 2, and there is an illumination angle distribution in the x-z plane which corresponds to that in the y-z plane of the setting according to FIG. 5.

Compared to the setting of FIG. 2, to adjust the setting according to FIG. 6, the first facet elements 8, 10 and 11 should be tilted and also the second facet element 21 should be tilted so that the radiation emanating from the first facet elements 10, 11 is correctly imaged in the illumination field 2.

In the setting according to FIG. 6, the first facet elements 8, 9 jointly eradiate the second facet element 23 and the first facet elements 10, 11 jointly eradiate the second facet element 21.

Figure 7:
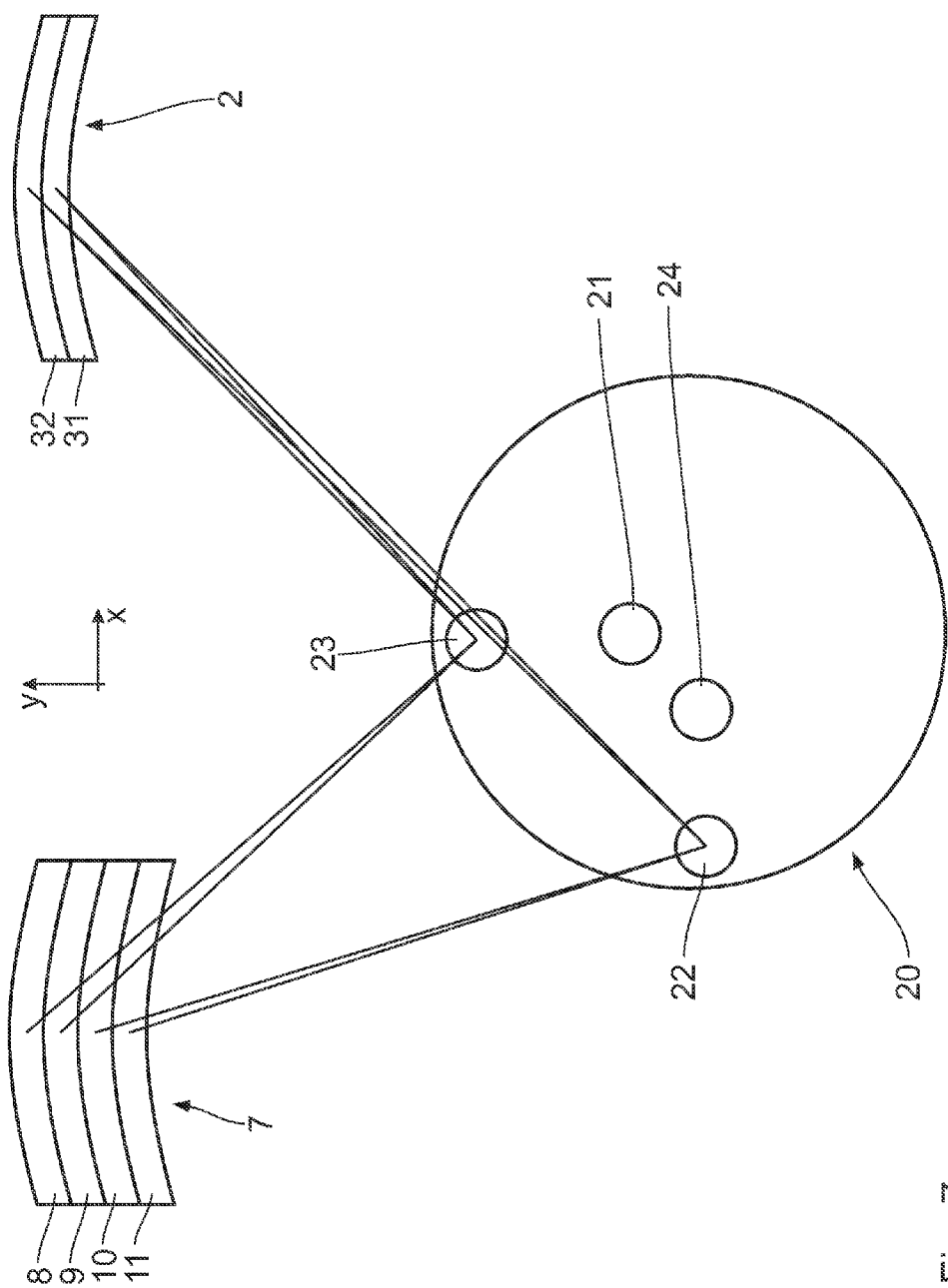
FIG. 7 a view similar to that of FIG. 3 having curved first facet elements.

FIG. 7 shows an illumination system like the illumination system of FIGS. 1 and 2, adjusted to an illumination setting like the setting of FIG. 3. Components corresponding to those which have already been described above with reference to FIGS. 1 to 6, have the same reference numerals and will not be described again in detail. In contrast to the rectangular first facet elements of the embodiments according to FIGS. 1 and 2, the first optical element 7 of the arrangement according to FIG. 7 has slightly arcuately curved first facet elements 8 to 11.

The curved first facet elements 8 to 11 are imaged in the curved partial fields 31, 32 by the optical arrangement 27.

Figure 8:
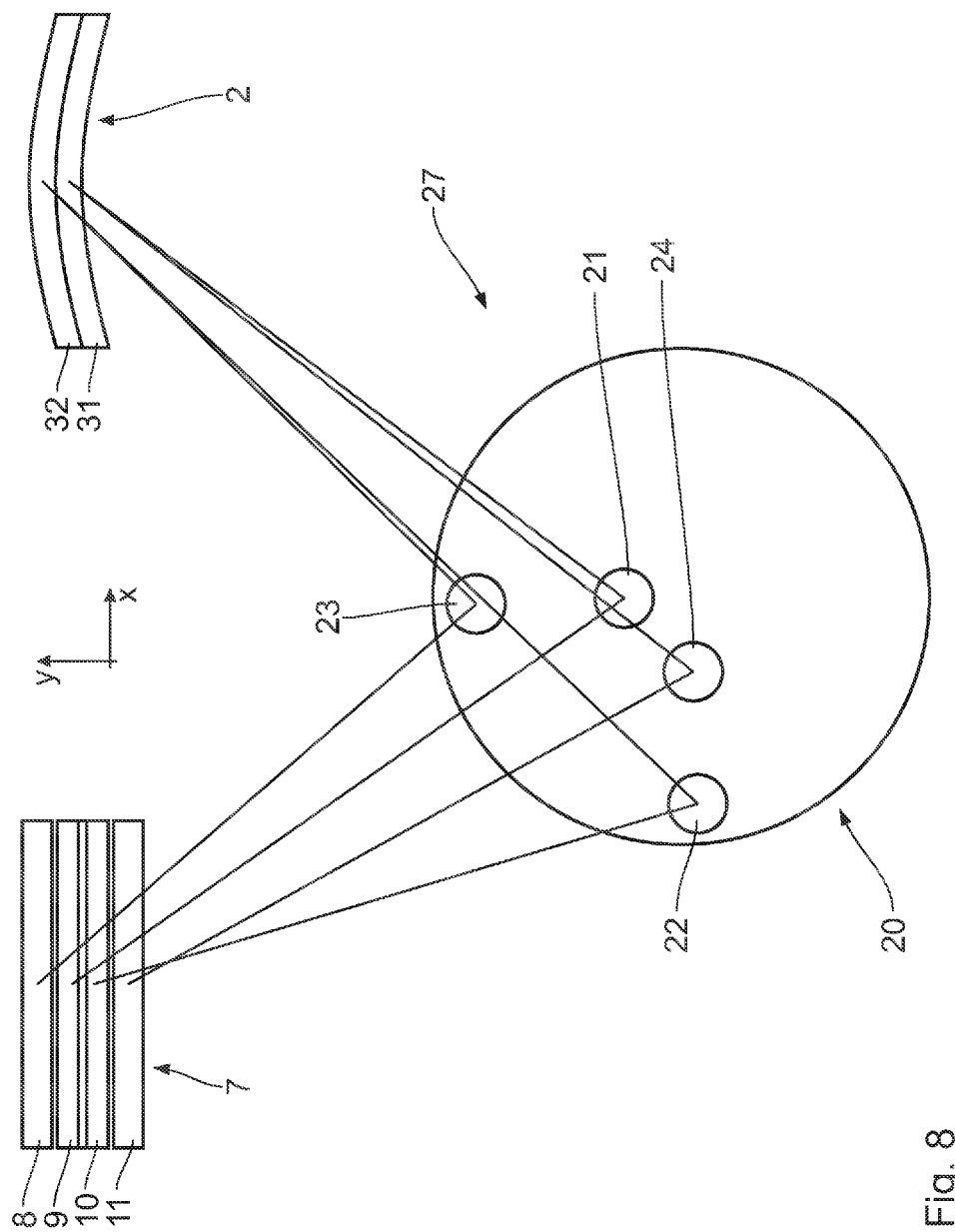
FIG. 8 a view similar to that of FIG. 2 having a different magnification.
Figure 9:
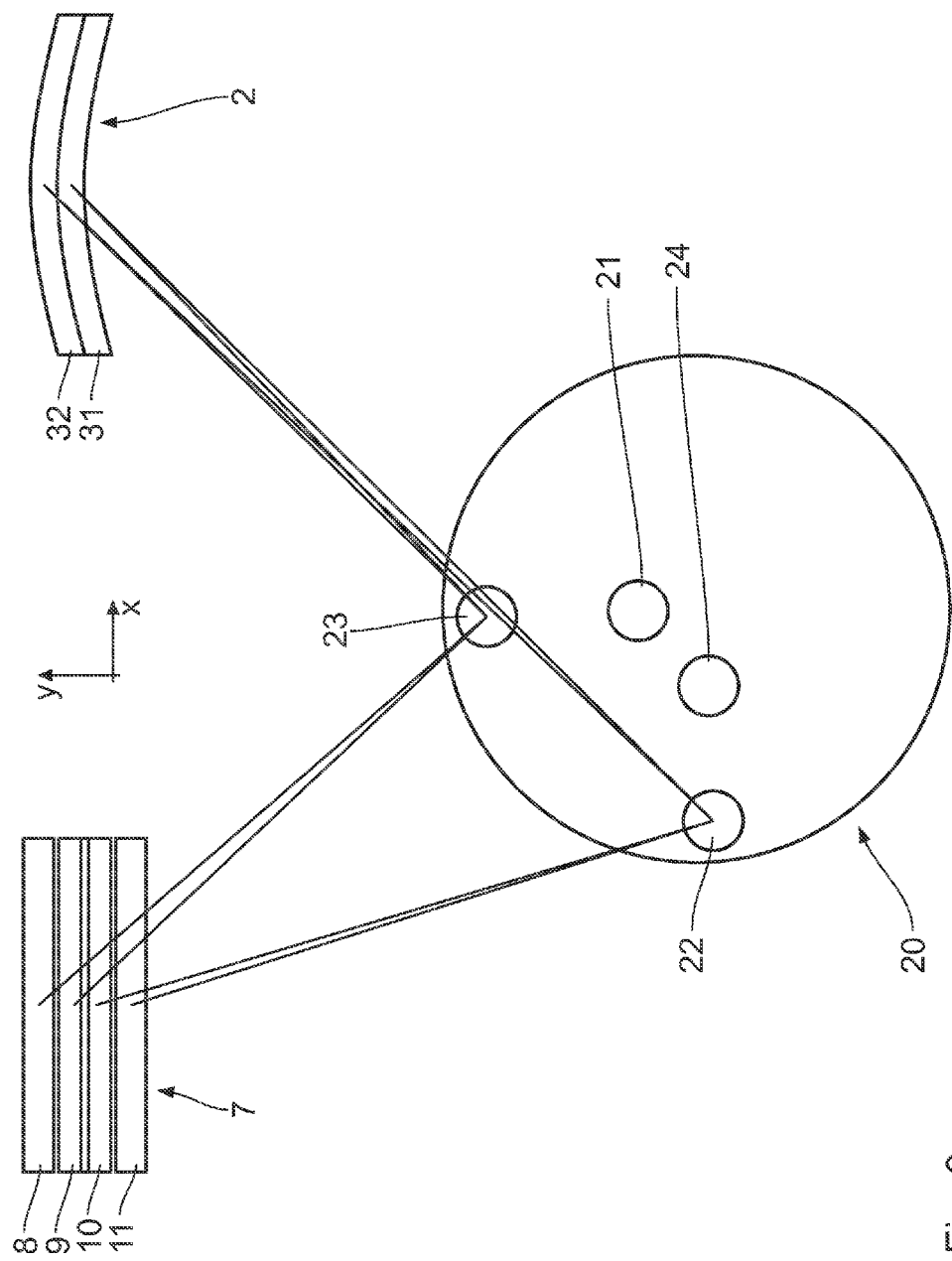
FIG. 9 a view similar to that of FIG. 3.

FIGS. 8 and 9 show an illumination system. Components which correspond to those already described above with reference to FIGS. 1 to 7 have the same reference numerals and are not described again in more detail.

In contrast to the embodiments according to FIGS. 1 to 7, the optical arrangement 27 according to FIGS. 8 and 9 has a positive magnification. The second optical element 20 as well other reflective elements like the elements 28 and 29 (not shown) belong to the optical arrangement 27. In FIGS. 8 and 9, the first facet elements 9 and 11 are imaged in the lower partial field 31 of the illumination field 2. The first facet elements 8 and 10 are imaged in the upper partial field 32.

FIG. 8 shows a conventional setting corresponding to that of FIG. 2. With respect to the guidance of the partial beams 12 to 15, the first facet element 8 is associated with the second facet element 23, the first facet element 9 is associated with the second facet element 21, the first facet element 10 is associated with the second facet element 22 and the first facet element 11 is associated with the second facet element 24.

FIG. 9 shows another illumination setting produced by tilting the first facet elements 9 and 11, so that a large annular setting like the setting of FIG. 3 is produced. The second facet element 23 is jointly acted on by the two first facet elements 8 and 9. The second facet element 22 is jointly acted on by the two first facet elements 10 and 11.

The illumination system 1 is part of a projection illumination installation for microlithography, with which an object having the object surface (e.g., a mask or a reticle) is imaged on a wafer to produce integrated components, for example microprocessors or memory chips.

The first optical element 7 may be configured such that only specific first facet elements may be tilted by actuators, while other first facet elements are stationary. The second optical element 20 may also be equipped accordingly with tiltable and stationary second facet elements. It also possible to equip the second optical element 20 in general with stationary second facet elements, in other words, not to provide a tilting option there.

In some embodiments, the number of first facet elements of the first optical element 7 is identical to the number of the second facet elements of the second optical element 20. Alternatively, in certain embodiments, the number of facet elements of the second optical element 20 is greater or smaller than the number of the first facet elements of the first optical element.

Although in embodiments described above a maximum of two first facet elements 8 to 11 are associated with the second facet elements 21 to 24, it is possible for more than two first facet elements to be associated in each case with a second facet element. The minimum number of the partial fields constructing the illumination field can increase accordingly.

In principle, it is possible also to configure at least individual components of the illumination system as transmissive components.

Other embodiments are in the claims.

What is claimed is:

1. An illumination system configured to illuminate an illumination field of an object surface with radiation, the illumination system comprising:

a first optical element comprising a plurality of facet elements having a first total number of facet elements, the plurality of facet elements of the first optical element including a first facet element and a second facet element;

an optical arrangement configured to image the facet elements of the first optical element into the illumination field, the optical arrangement comprising a second optical element which comprises a plurality of facet elements having a second total number of facet elements, the plurality of facet elements of the second optical element being configured to be impinged by the radiation via the first optical element; and a plurality of actuators, wherein:

the facet elements of the first optical element and the facet elements of the second optical element used to illuminate the illumination field are positioned via respective actuators of the plurality of actuators so that the illumination field is divided into a first partial field and a second partial field;

the first partial field and the second partial field provide a sequential illumination intensity profile in a direction of the object surface;

the second total number of facet elements is less than the first total number of facet elements;

each facet element of the second optical element is assigned to at least one facet element of the first optical element;

the first facet element is configured to be imaged to the first partial field;

the second facet element is configured to be imaged into the second partial field;

the direction of the object surface is a direction along which the object surface is displaced; and the illumination system is an EUV lithography illumination system.

2. The illumination system of claim 1, wherein the first partial field does not overlap with the second partial field.

3. The illumination system of claim 1, wherein the first partial field overlaps with the second partial field in an area, the area is smaller than the first partial field, and the area is smaller than the second partial field.

4. The illumination system of claim 1, wherein an intersection between the first and second partial fields is less than 95% of an area of the smaller of the first and second partial fields.

5. The illumination system of claim 1, wherein an intersection between the first and second partial fields is less than 90% of an area of the smaller of the first and second partial fields.

6. The illumination system of claim 1, wherein an intersection between the first and second partial fields is less than 80% of an area of the smaller of the first and second partial fields.

7. The illumination system of claim 1, wherein an intersection between the first and second partial fields is less than 60% of an area of the smaller of the first and second partial fields.

8. The illumination system of claim 1, wherein an intersection between the first and second partial fields is less than 40% of an area of the smaller of the first and second partial fields.

9. The illumination system of claim 1, wherein an intersection between the first and second partial fields is less than 20% of an area of the smaller of the first and second partial fields.

10. The illumination system of claim 1, wherein the facets of the first and second optical elements are configured so that, during use of the illumination system, the first and second partial fields illuminate at selected illumination angles.

11. The illumination system of claim 1, wherein the facets of the first and second optical elements are configured so that the illumination field is an assembly of individual partial fields which together define the complete illumination field.

12. The illumination system of claim 1, wherein the first and second optical elements are configured so that the entire illumination field is not illuminated via either of the partial fields.

13. The illumination system of claim 1, wherein the first and second optical elements are configured so that the entire illumination field is defined by an assembly of individual partial fields, and the entire illumination field is not illuminated via any of the partial fields.

14. The illumination system of claim 1, wherein the facets of the first and second optical elements are configured so that facet elements of the second optical element are irradiated by a plurality of facet elements of the first optical element which are at a spatial distance from each other.

15. The illumination system of claim 1, wherein the facets of the first and second optical elements are configured so that more than three facet elements of the first optical element irradiate a facet element of the second optical element with radiation.

16. The illumination system of claim 1, wherein the actuators are configured to move at least some of the facet elements of the first optical element between setting positions so that in each setting position the corresponding partial beam of radiation is deflected by the movable facet element of the first optical element, wherein at least one of the facet element of the second optical element is configured to be acted on by at least two different facet elements of the first optical element.

17. The illumination system of claim 1, wherein a number of partial fields of the illumination field corresponds to a maximum number of facet elements of the first optical element which are able to act on the same facet element of the second optical element.

18. The illumination system of claim 1, wherein the first and second partial fields are adjacent partial field strips.

19. The illumination system of claim 18, wherein the first and second partial fields have the same surface area.

20. The illumination system of claim 19, wherein the facet elements of the first optical element are curved.

21. The illumination system of claim 20, wherein the first and second partial fields are curved.

22. The illumination system of claim 19, wherein the first and second partial fields are curved.

23. The illumination system of claim 1, wherein precisely two adjacent facet elements of the first optical element act on at least one of the facet elements of the second optical element.

24. The illumination system of claim 1, wherein the actuators are configured to displace at least one of the facet elements of the second optical element between first and second positions.

25. The illumination system of claim 1, wherein the facet elements of the first optical element are reflective elements.

26. The illumination system of claim 25, wherein the facet elements of the second optical element are reflective elements.

27. The illumination system of claim 1, wherein the facet elements of the second optical element are reflective elements.

28. The illumination system of claim 1, wherein the number of the facet elements of the first optical element is identical to the number of the facet elements of the second optical element.

29. An illumination system configured to illuminate an illumination field of an object surface with radiation, the illumination system comprising:

a plurality of first facet elements configured to produce secondary light sources when impacted by the radiation, the plurality of first facet elements having a first total number of facet elements;

a plurality of second facet elements, the plurality of second facet elements having a second total number of facet elements, the second total number of facet elements being smaller than the first total number of facet elements; and a plurality of actuators, wherein:

the second facet elements are positioned to illuminate the illumination field via respective actuators of the plurality of actuators so that at least one corresponding first facet element is assigned to each of the second facet elements used to illuminate the illumination field and so that only a part of the illumination field is illuminated by the at least one corresponding first facet element;

the illumination system is configured so that the facet elements of the first optical element and the facet elements of the second optical element used to illuminate the illumination field and to position the facet elements of the first optical element and the facet elements of the second optical element via respective actuators of the plurality of actuators so that the illumination field is divided into a first partial field and a second partial field, the first partial field and the second partial field provide a sequential illumination intensity profile in a direction of the object surface, the direction of the object surface is a direction along which the object surface is displaced; and the illumination system is an EUV lithography illumination system.

30. The illumination system according to claim 29, wherein the illumination system is configured so that, during use of the illumination system, the at least one corresponding first facet element to each of the second facet elements used to illuminate the illumination field is modified when an illumination setting is modified.

31. The illumination system according to claim 30, wherein the illumination system is configured so that, during use of the illumination system, the at least one corresponding first facet element to each of the second facet elements used to illuminate the illumination field is modified without any loss of radiation.

* * * * *

UNITED STATES PATENT AND TRADEMARK OFFICE
CERTIFICATE OF CORRECTION

PATENT NO. : 9,671,608 B2  Page 1 of 1
APPLICATION NO. : 14/489943
DATED : June 6, 2017
INVENTOR(S) : Martin Endres and Jens Ossmann It is certified that error appears in the above-identified patent and that said Letters Patent is hereby corrected as shown below:

In the Specification

Column 2, Line 10, delete "Lorenzian," and insert -- Lorentzian, --.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*